United States Patent [19]

Wright et al.

[11] 4,387,506
[45] Jun. 14, 1983

[54] COMPONENT INSERTING MACHINE

[75] Inventors: Henry L. Wright, Ipswich; Vitaly Bandura, Danvers; Daniel W. Woodman, Jr., Beverly, all of Mass.

[73] Assignee: USM Corporation, Farmington, Conn.

[21] Appl. No.: 271,836

[22] Filed: Jun. 9, 1981

[51] Int. Cl.³ ............................................. H05K 3/30
[52] U.S. Cl. .................................... 29/714; 29/564.1; 29/741; 29/759; 221/123; 221/293; 414/126
[58] Field of Search ................ 29/741, 759, 703, 714, 29/715, 564.1; 414/126, 222, 224; 221/123, 293

[56] References Cited

U.S. PATENT DOCUMENTS

| | | | |
|---|---|---|---|
| 4,063,347 | 12/1977 | Woodman, Jr. | 29/564.1 |
| 4,149,641 | 4/1979 | De Vita et al. | 414/126 |
| 4,327,483 | 5/1982 | Zemek et al. | 29/741 |

*Primary Examiner*—Carl E. Hall
*Attorney, Agent, or Firm*—Alan N. McCartney

[57] ABSTRACT

A high performance machine for selecting a variety of electronic components by at least two pickers movable along opposite sides of a row of magazines for delivery to a shuttle intersecting said row and which delivers each component to a conditioning means.

11 Claims, 19 Drawing Figures

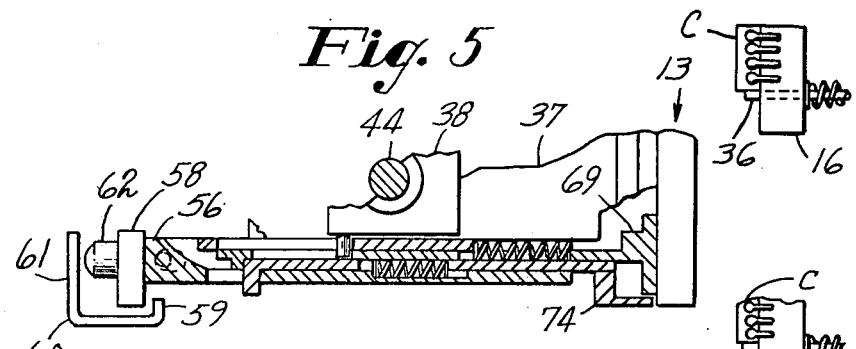
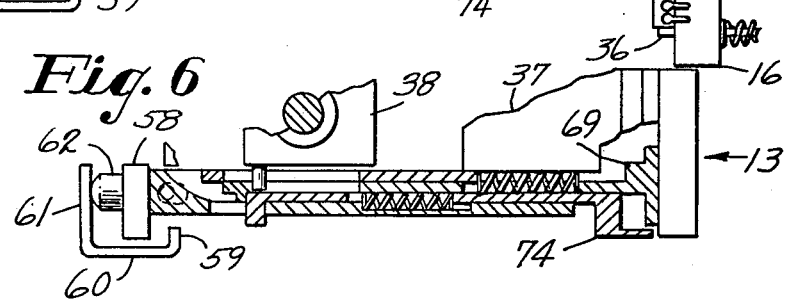
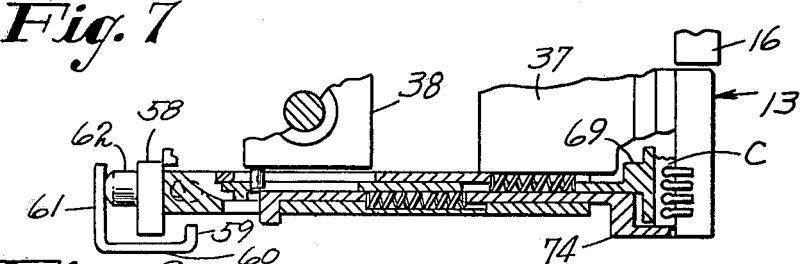
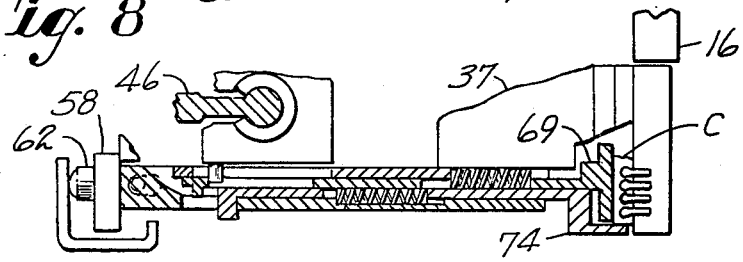
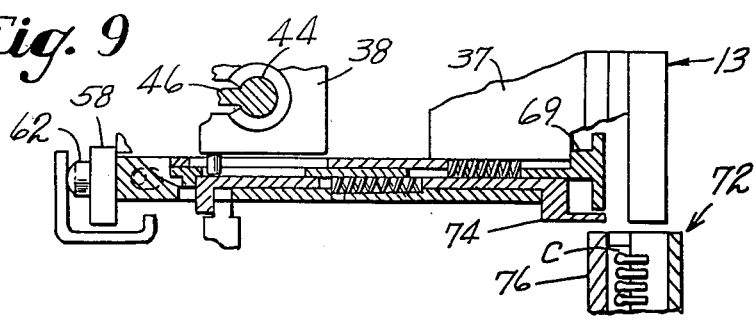

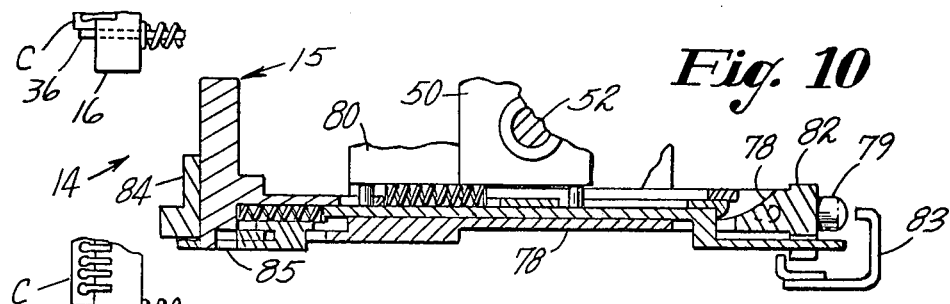
Fig. 10
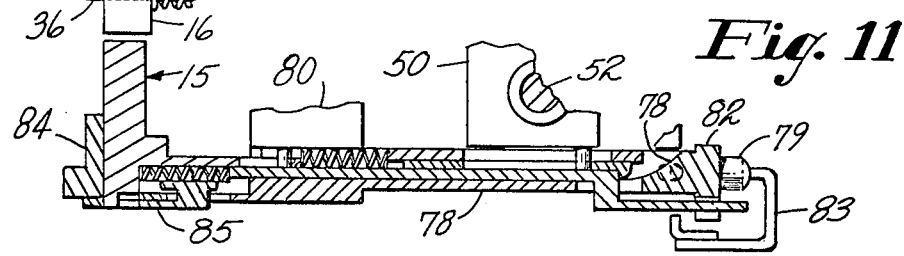
Fig. 11
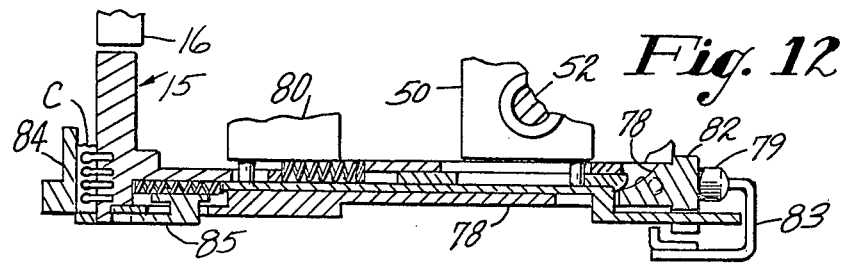
Fig. 12
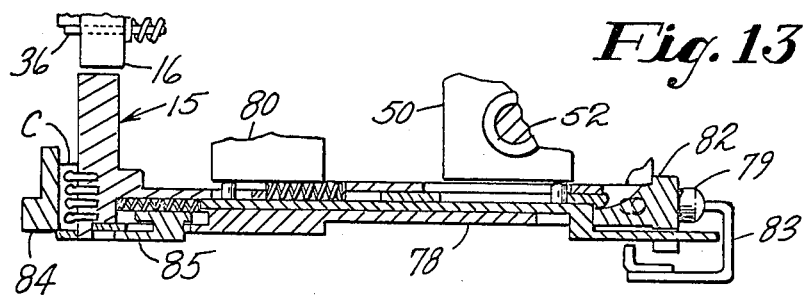
Fig. 13
Fig. 14
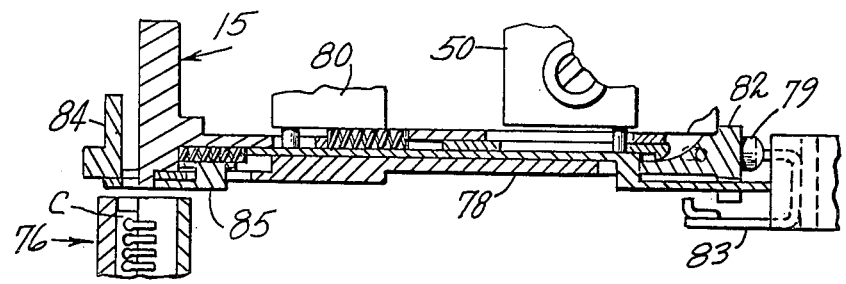

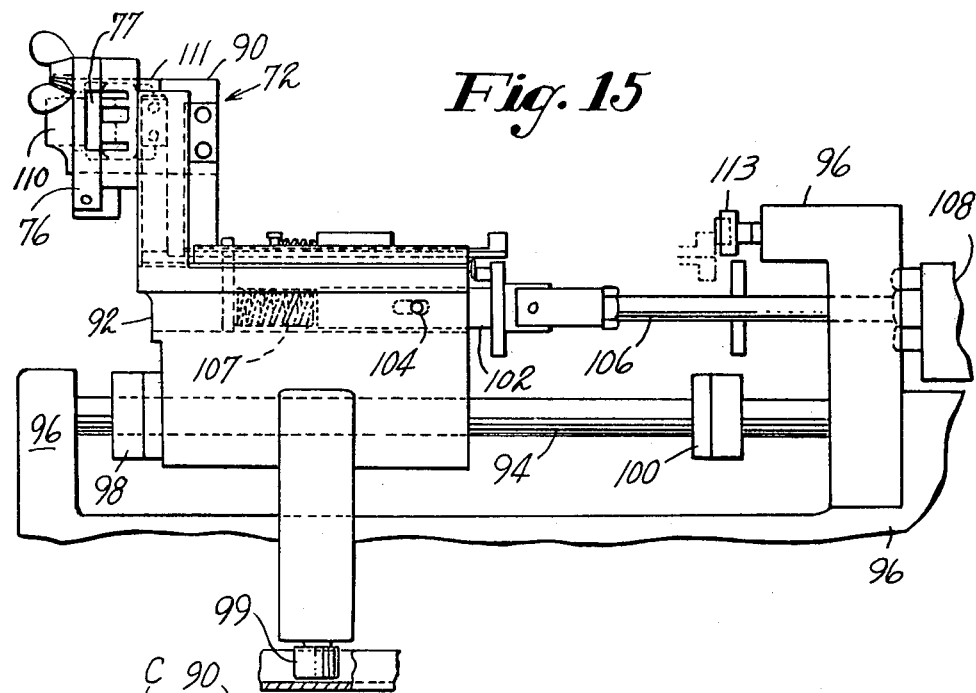
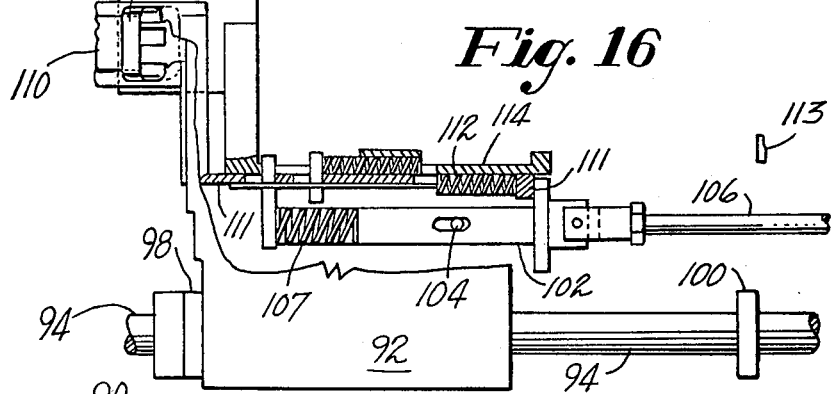
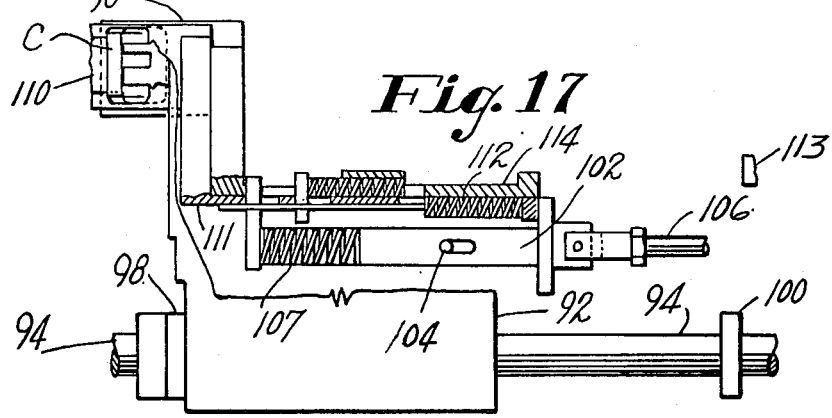

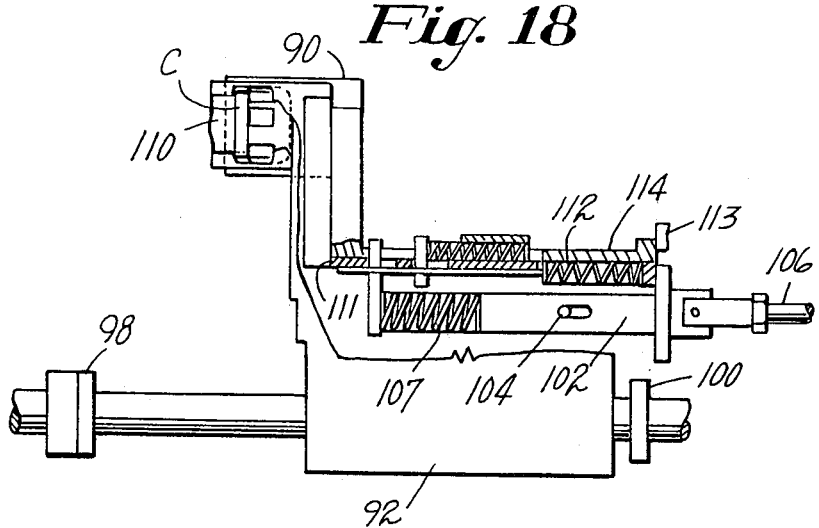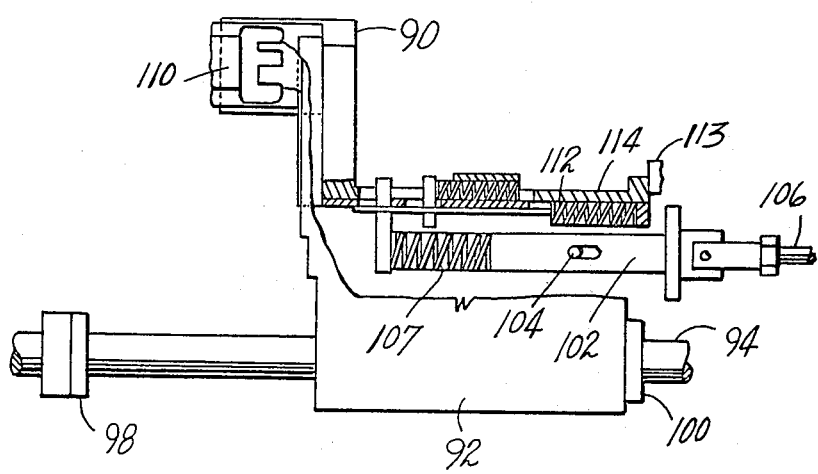

COMPONENT INSERTING MACHINE

FIELD OF INVENTION

This invention relates to a high performance machine for selecting a variety of electronic components such as of the type commonly known as "DIP" and component sockets from a plurality of magazines and for inserting the selected components or sockets in circuit boards which are automatically positioned under the control of a programmable computer.

BACKGROUND OF THE INVENTION

DESCRIPTION OF THE PRIOR ART

Multi-lead DIP components have been processed and inserted in circuit boards by machines such as disclosed in U.S. Pat. Nos. 3,591,040 and 3,550,238. As there shown, components are selectively aligned with an inserting mechanism by shifting a magazine and releasing the components singly for mounting by inserting means after their leads are straightened, if necessary. With a larger variety and supply of components, larger capacity magazines were held stationary and shiftable means selected and deposited single components as disclosed in U.S. Pat. No. 3,727,284. U.S. Pat. No. 4,063,347 shows a machine for selecting a variety of DIP components from a plurality of magazines by a computer controlled picker mechanism and delivering the selected components to a lead straightening unit and thence to a circuit board for insertion. As described in said U.S. Pat. No. 4,063,347 a single picker is moved along a row of magazines and selects particular components for transport one-at-a-time to a lead conditioning unit. While the machine improved on the efficiency, reliability of control and performance of machines previously available, the output of the machine is limited to and dependent on the output of the last to occur operation before another component could be selected.

The machine illustrative of the present invention provides an improved means for selecting components from a variety thereof with a greater efficiency and output and taking full advantage of the ability of presently available programmable computer directed controls to keep track of a variety of near simultaneously occuring operations and to program both selection and delivery of the components.

SUMMARY OF THE INVENTION

It is a general object of the invention to provide an improved component inserting machine in which a plurality of magazines each dedicated to a particular type of component are arranged along a path. At least two picker mechanism are moved along opposite sides of the magazine path in a noninterferring relation to select components for delivery to a component conditioning unit.

A further object provides for the pickers to be moved simultaneously between the conditioning unit and the magazines to select the components from opposite sides of the path in noninterferring relation and greatly increasing output of presently available machines.

Accordingly, each picker is adapted to select components from any of a plurality of raceway channels of the magazines independently of the other picker and to deposit the selected component in a shuttle adapted to transfer the component to a conditioning unit. The pickers are arranged to operate simultaneously during their selecting function and to be limited as to simultaneous operation only in that only one picker at a time can select from the same raceway channel or deposit a component in the shuttle. Thus, the arrangement provides for selected components to be in each of the pickers and in the shuttle simultaneously.

These and other features of the invention together with various novel details will be described with reference to a preferred embodiment.

DESCRIPTION OF THE DRAWINGS

FIGS. 5 through 9 are progressive views of fragments of the front picker mechanism and related parts;

FIGS. 10 through 14 are progressive views of fragments of the rear picker mechanism and related parts;

FIG. 15 is a plan view of the shuttle mechanisms; and

FIGS. 16 through 19 are fragmentary progressive views of the shuttle mechanism seen in FIG. 15.

Referring to FIGS. 1 to 4, the machine is provided with a plurality of magazines 10 generally similar to those shown in U.S. Pat. No. 4,063,347 arranged in a row forming a path along opposite sides of which a front picker 12 and a rear picker 14 move back and forth in a non-interferring relation. As controlled by means such as a computer or tape reader 8, the pickers select individual components from raceways 16 in each magazine and transport and deposit the selected component in a shuttle 72 for transfer to a conditioning unit 18 which forms or straightens leads extending from opposite sides of each component. The lead conditioning unit is generally similar to that described in said U.S. Pat. No. 4,063,347. After the component leads are conditioned the component is released and directed by a chute 20 (FIGS. 2 and 3) to a transfer mandrel 22 and at the appropriate time is moved by a thruster 24 to a stop 26 for accurate location. The component is then gripped by a pair of notched fingers 28 which space adjacent component leads and bend the leads inwardly to match the spacing of holes in a circuit board B on which the component is to be mounted. The fingers move the component bodily downward toward the board and a pusher 30 seats and holds the component on the board while the fingers open to release the component. A cut-clinch unit 32 underlying the board is arranged to cut the ends of the leads and clinch them against the underside of the board.

Figure 1:
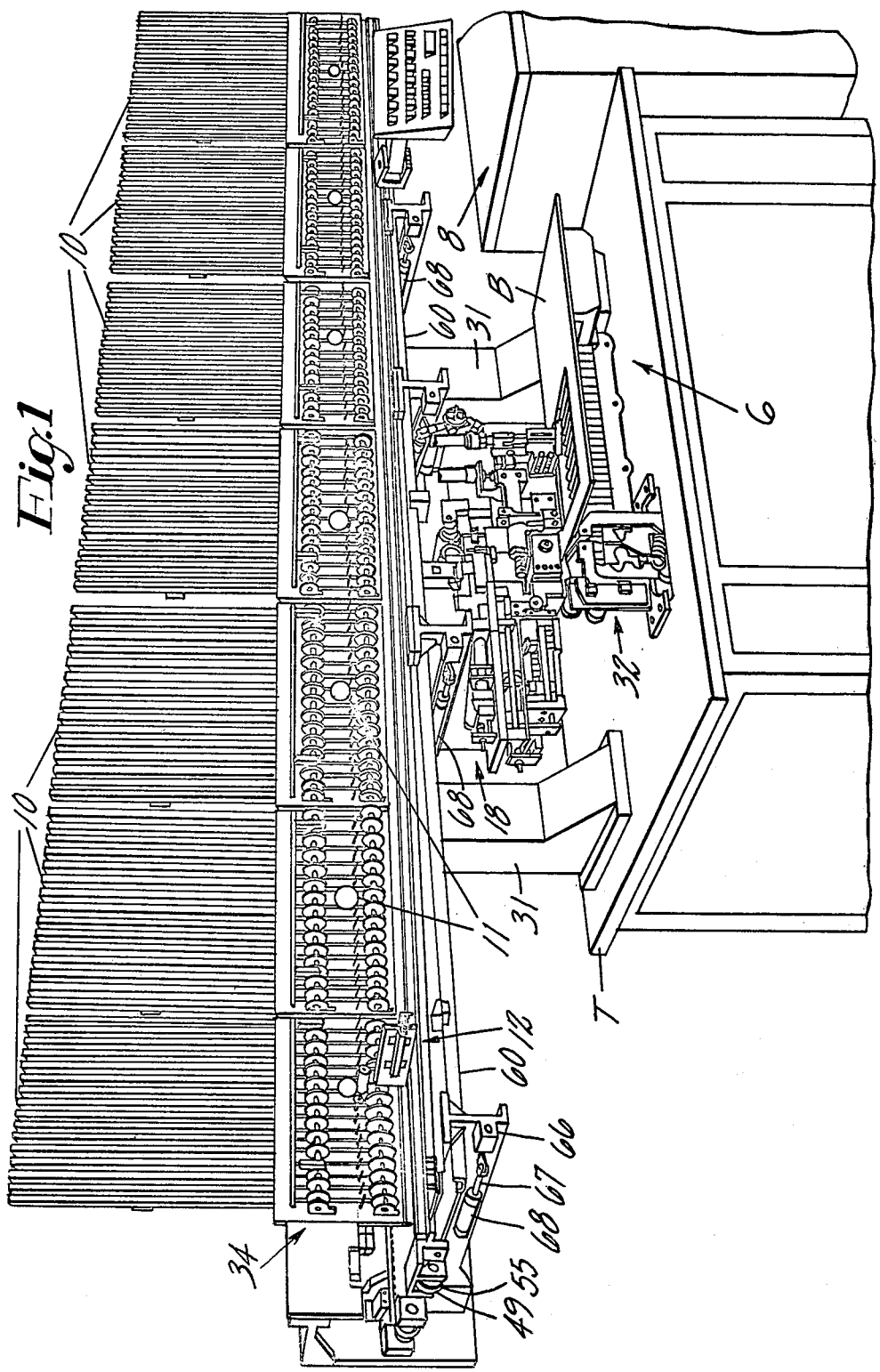
FIG. 1 is a perspective view of a machine embodying the present invention.

Each magazine 10 is secured by a bolt having a hand knob 11 (FIGS. 1 and 2) to a bracket 34 mounted on the machine frame which includes a pair of posts 31 upstanding from a table T. Each magazine has two pins 32, one shown in FIGS. 3 and 4, received in locating holes 33 in the bracket, each pin having an extension coacting with an associated switch 35. Each magazine has a plurality of raceways 16 each containing components having a particular center spacing (C.S.) of outwardly and downwardly extending component leads which for example may be 0.300" C.S., 0.400" C.S. or 0.600" C.S. In the preferred embodiment, the machine is shown as provided with seven magazines 10, each dedicated to components all having the same lead center spacing.

Obviously more or less magazines and other center spacing sizes may be provided. The two locating pins of each magazine are adapted to actuate the associated switches in a manner peculiar to and indicative of the center spacing of the leads of the components in the raceway channels of the magazine. Thus, each magazine has its own peculiar pattern of short and long locating pins, depending on the center spacing (C.S.) of the leads of the components for which the magazine is dedicated adapted to actuate the switches in a manner indicating the C.S. of the components.

| For Example: | Magazine Component C.S. | Left Switch | Right Switch |
|---|---|---|---|
| | .300" C.S. | On | On |
| | .400" C.S. | On | Off |
| | .600" C.S. | Off | On |
| | No Magazine | Off | Off |

Channel to channel spacing also varies for each magazine depending on the center spacing of the component leads for which the magazine is dedicated so that identification of magazine type in each of the seven positions is necessary to allow accurate travel and registration of the pickers with the desired channel. It should be obvious that the arrangement of locating pins and associated switches are only illustrative of a preferred embodiment and could be indicative of component attributes other than lead center spacing and could involve other types of indicating and sensing means. Certain concepts involved also are the subject of copending application for U.S. Pat. Ser. No. 271,835, filed June 9, 1981 in the name of the present inventors and such application is herein incorporated by reference for further description if desired.

Figure 2:
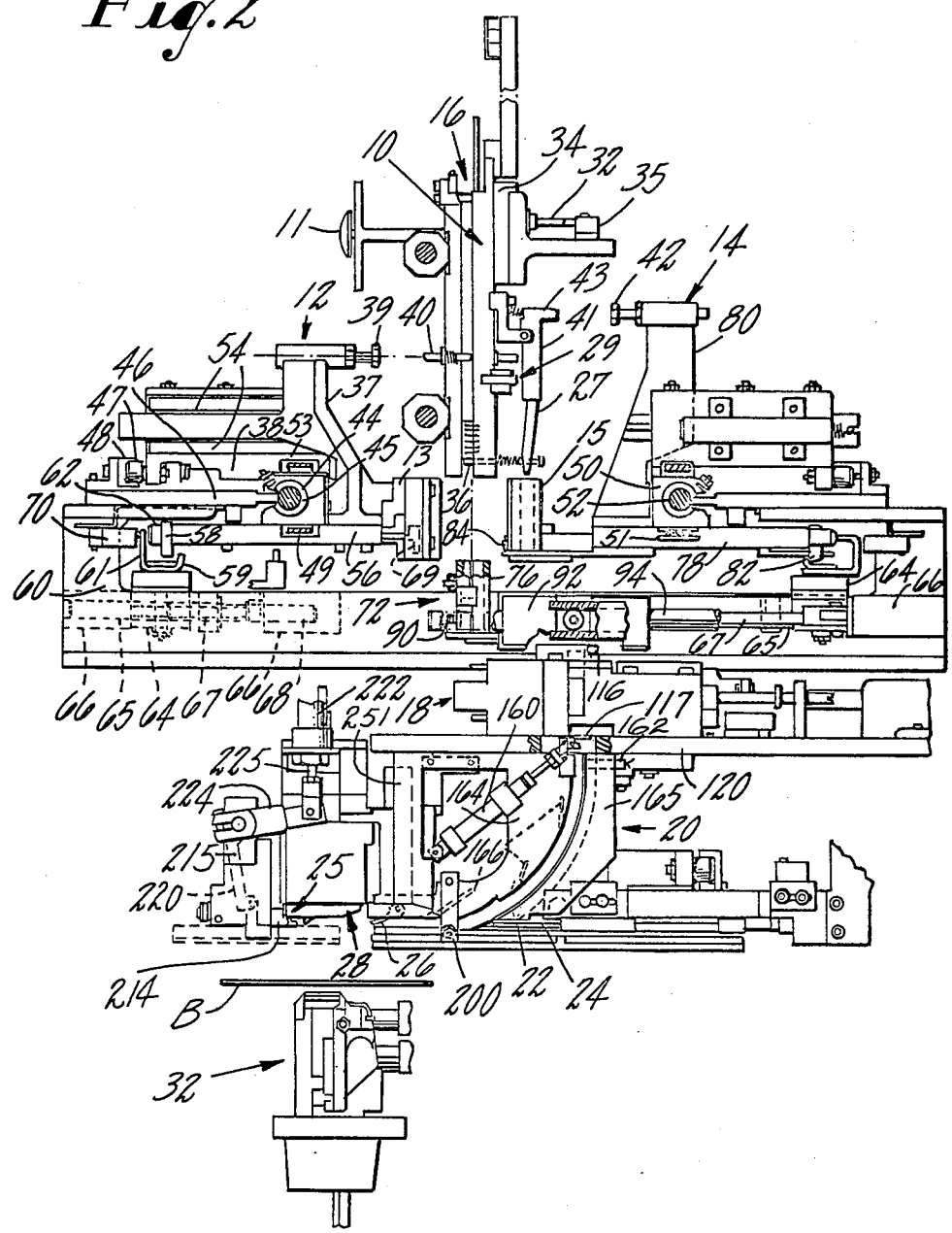
FIG. 2 is a side elevation of the machine with parts of the machine frame removed for clarity.
Figure 3:
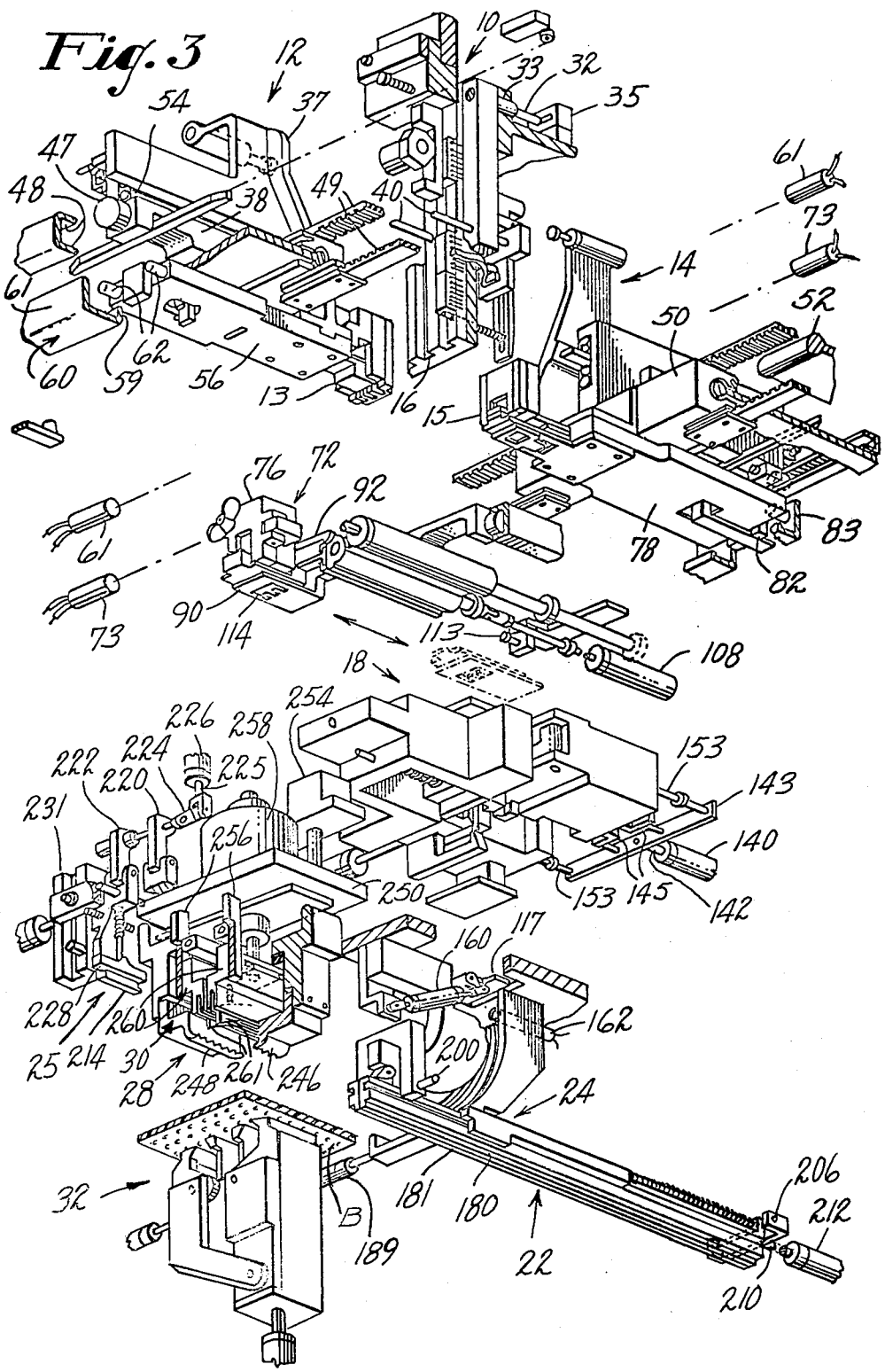
FIG. 3 is a schematic view in perspective of the mechanisms shown in FIG. 2.
Figure 4:
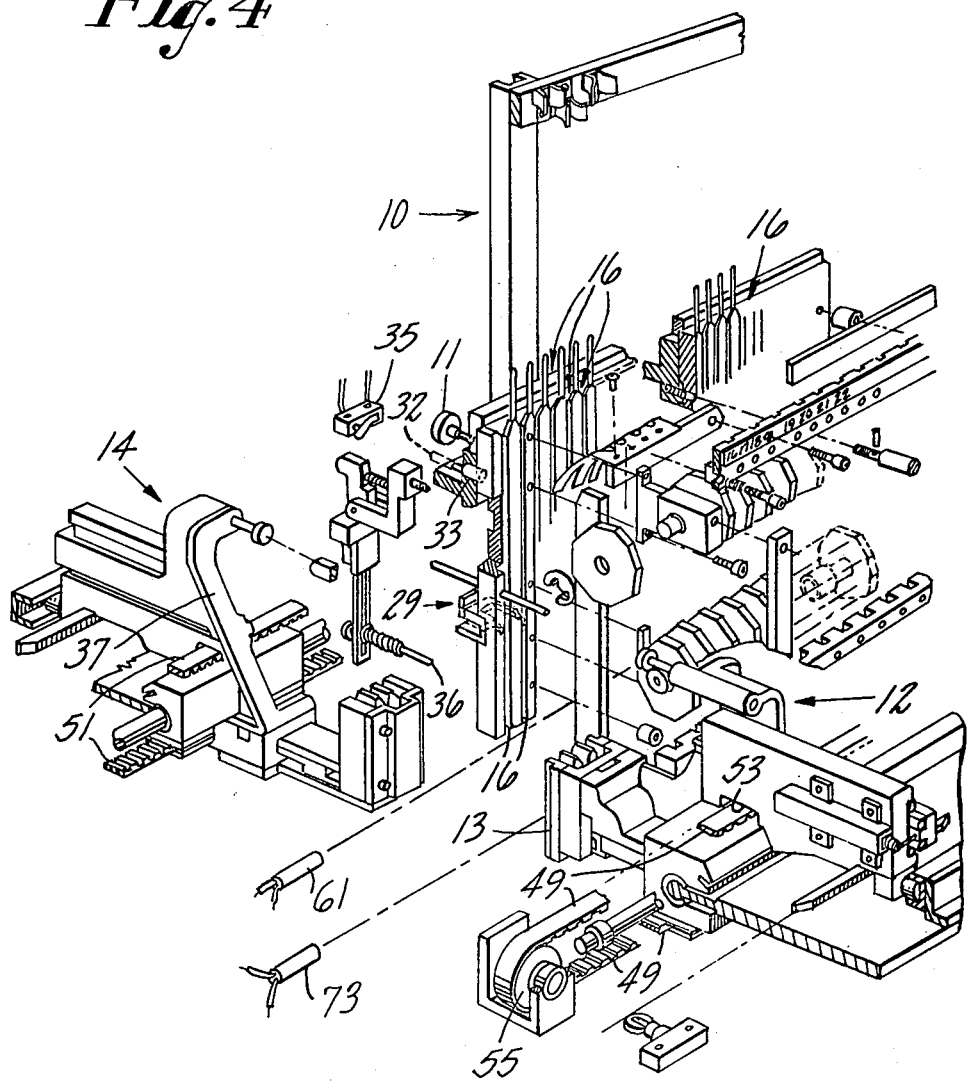
FIG. 4 is a schematic view in perspective on an enlarged scale of the component picker selecting means.

Referring to FIG. 4, the magazines each have a number of raceway channels 16 each adapted to contain a vertical column of similar components. Each channel is settable to suit variations in component thickness by adjustment of two eccentric wheels which position a vertical bar in and out. This adjustment is generally similar to that shown in U.S. Pat. No. 4,063,347 which is incorporated herein by reference if a more detailed description is desired. Each channel is provided with an escapement operable from either side of the magazines by either the front or rear picker 12 and 14 respectively to control component release. The escapement mechanism for each channel includes a plunger 36 (FIG. 2) which acts as a stop for the lowest component in the channel and a pair of grippers 29 which holds the second component from dropping when the plunger 36 is retracted to release the lowermost component. The escapement mechanism described to this point is generally similar to that described in U.S. Pat. No. 4,149,641 which is incorporated herein by reference for a more detailed discussion if desired. The escapement, however, is operated in a different manner from that described in said U.S. Pat. No. 4,149,641 alternately by either picker mechanism. The front picker 12 is provided with a receptacle 13 adapted to be reciprocated from a retracted position as seen in FIGS. 2, 3 and 5 to an inward position registered with a selected raceway channel as seen in FIG. 7. The receptacle is carried by a bracket 37 adapted to reciprocate on a carrier 38. The bracket has an actuator stud 39 which during inward movement engages and depresses a pin 40 and causes a lever 41 to be swung counterclockwise as best seen in FIG. 2. A forked tail piece 27 of the lever acts during such movement to retract the plunger 36 to release the lowermost component which drops by gravity into the underlying picker receptacle 13 (see also FIG. 7). A flat on lever 41 at this time also actuates the escapement grippers to hold the next component in the channel from dropping. The rear picker 14 has a stud 42 which also may swing the lever 41 counterclockwise by engagement with an arm 43 of lever 41 during inward movement of the rear picker to release a component into the rear picker receptacle 15 when so selected. When a component drops into either picker receptacle 13 or 15, a light source and cell 61 (FIG. 3) detects such passage and signals the control unit 8 to retract the receptacle and commence movement of the picker toward the shuttle 72.

PICKER MECHANISM

The pickers 12 and 14 are each moved independently between selected magazine channels and the component lead conditioning unit 18 under the control of the unit 8. The front picker carrier 38 has a split sleeve bearing 44 slidable on a guide 45 carried by a plate 46 fixed on the machine frame. For further guidance, the carrier has a roll 47 running in a guideway 48 also mounted on the plate 46. The lower reach of a toothed belt 49 is secured to the underside of the carrier 38 as best seen in FIGS. 2 and 4, while the upper reach passes freely through an opening 53. The belt runs over a pulley 55 (FIG. 4) at one end and at the opposite end of the machine is driven by a reversible motor (not shown) under the control of the unit 8. To this point the picker drive is similar to that disclosed in said U.S. Pat. No. 4,063,347 to which reference may be had for a detailed description. The rear picker carrier 50 is mounted for movement along a guide 52 in similar fashion as for the front picker carrier and is driven by a toothed belt 51 in a manner similar to that for the belt 49.

In the operation of the machine, the control unit 8 causes the pickers to be moved along guides 45 and 52 to a particular raceway channel of one of the seven magazines for selecting a particular component to be applied to a circuit board according to a programmed sequence. During such movement of the picker receptacle for example, receptacle 13, of the front picker 12 is retracted as seen in FIGS. 3, 4 and 5. In retracted position the receptacles 13 and 15 of both pickers can pass without interference in their movements along the guides 45 and 52 as long as at least one of the receptacles is in retracted position. For moving the receptacle 13 from its retracted position to its advanced position registered with a selected magazine channel, the bracket 37 is mounted for reciprocation in guideways 54 (FIG. 2) on the carrier 38. A plate 56 secured to the bracket 37 and underlying the carrier 38 has at one end a lug 58 which lies within an inner wall 59 of a channel member 60 also having another upstanding wall 61 adapted to engage two yieldable rods 62. The machine is provided with two channel members 60 extending along the front of the machine each of which has at opposite ends a lug 64 (FIG. 2) from which extends a rod 65 mounted for reciprocation in bearings 66. Each lug is connected to a piston rod 67 extending from a cylinder 68 secured at one end to the machine frame (see also FIG. 1). By operating the cylinders 68 simultaneously at opposite ends of the channel member 60, the member is moved inward to move the plate 56, receptacle 13 and the picker bracket 37 toward the selected raceway magazine. Referring to FIGS. 5 to 8 there is shown the sequence of operation of the front picker 12 in which the receptacle 13 is moved into registration with the selected magazine channel and a clamp 69 is retracted, as seen in FIG. 7. During such movement, the magazine escapement is operated by the stud 39 on bracket 37 as above described to retract the stop 36 allowing the lowermost component to drop by gravity from the magazine into the receptacle 13 onto a gate 74 while the next component is held by fingers in the manner fully described in said U.S. Pat. No. 4,149,641. Reversal of the cylinders 68 then causes the receptacle 13 to be retracted until the wall 61 of the channel actuates a limit switch 70 (FIG. 2) and the belt operating motor is actuated to move the front picker belt 49 and the front picker receptacle along the magazines and into alignment with a shuttle 72. The cylinders 68 are again operated under the control of unit 8 moving the picker receptacle inwardly again until it registers with shuttle 72. During such movement, the clamp 69 releases the component and a gate 74 is retracted as seen in FIG. 9 allowing the component to drop by gravity into the shuttle bucket 76. A light source and detector cell 73 (FIG. 3) detects passage of a component from the picker into the shuttle.

The rear picker 14 is operated in somewhat the same manner except that it travels at the opposite side of the magazine and acts directly against the lever 43. To this end, the receptacle 15 is mounted on the inner end of a plate 78 (FIGS. 2 and 10 to 14) secured to the picker bracket 80 which is mounted in guideways (not shown) on the carrier 50 similar to the guideways 54 for the front picker bracket 37. The plate 78 has a lug 82 and yieldable rods 79 received between the walls of the associated channels 83 which are similar to and mounted and operated in the same general manner as the channel members 60 for the front picker. In the operation of the machine, the rear picker receptacle 15 is moved into registration with a selected magazine channel. During such movement, the stud 42 (FIG. 2) on the rear picker bracket 80 swings the lever 41 to retract the stop pin 36 releasing the lowermost component which drops into the rear picker receptacle 15 as seen in FIG. 12. Also during such movement a component clamp 84 is moved out of the drop path of the component as best seen by a comparison of the positions of the various parts shown in the progressive views of the rear picker mechanism shown in FIGS. 10 to 13. At this time a gate 85 underlying receptacle 15 supports the component. After retraction, the rear picker is moved from the magazine parallel to the magazine into alignment and registered with the shuttle 72 and gate 85 is retracted as seen in FIG. 14 under the control of the unit 8 in the same manner as for the front picker unit. The cell 73 also detects the passage of a component from the rear picker into the shuttle and signals the control unit 8 to cause the next operation.

SHUTTLE MECHANISM

The shuttle 72 (FIGS. 2, 3 and 15) has a container 76 adapted to receive any size of component selected from a magazine channel and deposited from one of the picker receptacles 13 and 15 as above described. In its receiving position the shuttle occupies a central position shown in FIG. 2 for receiving components from either of the pickers. A gate 90 underlying the container 76 prevents the component from dropping through the receptacle when first received from a picker. The light source and photocell 73 detects entry of a component into the shuttle and through the unit 8 causes the shuttle to be moved from the receiving position to a depositing position registered with an opening in the lead conditioning unit 18. To this end, the shuttle has a carrier 92 (FIG. 15) mounted for reciprocation on a rod 94 fixed in a bracket 96 which is secured to the machine frame. A stop 98 on the rod determines the inner component receiving position of the shuttle and a stop 100 also on the rod locates the shuttle for registration with the lead conditioning unit 18. A roll 99 on the carrier runs in a guideway for further support. A rod 102 is mounted for axial movement in a hole in the carrier 92 as limited by a pin and slot connection 104 and abuts a compressed spring 107 in the carrier. The other end of rod 102 is connected to a piston rod 106 extending from a cylinder 108 secured to the bracket 96. A clamp 110 extending from a slide 111 guided in the carrier 92 is in the open condition as seen in FIGS. 15 and 16 permitting entry of a component into the shuttle container from a picker. Upon a signal from the cell 73 that a component has entered the shuttle the cylinder 108 is actuated moving the shuttle to the right. Referring to FIGS. 16 to 17, it may be seen that the initial movement of the rod 102 allows the clamp slide 111 to move to the right to the position seen in FIG. 17 while the spring 107 holds the shuttle in its initial position (compare FIGS. 16 and 17). This movement of the slide 111 causes the clamp 110 to be pressed against the body of the component C in the shuttle container by a spring 112 to the limit of the pin and slot connection 104 (see FIG. 17). As seen in FIGS. 18 and 19, further movement of the shuttle causes a stop 113 carried by the bracket 96 to hold a slide 114 on which the gate 90 is mounted while the shuttle continues its movement to the right into engagement with the stop 100 (compare FIGS. 18 and 19). This causes an opening 114 (FIG. 3) in the gate 90 to register with the opening in the bottom of the shuttle container. At the same time during the continued movement of the shuttle carrier 92 and its container, the clamp 110 and gate 91 also are held against movement releasing the component which then drops from the shuttle into the opening of the conditioning unit 18 and onto a gate 117 (FIG. 2). A light source and photocell 116 detects passage of the component into the lead conditioning unit 18.

The conditioning unit shown in FIG. 2 is adapted to straighten and/or form the leads of each component deposited therein in order to avoid jamming or misplacement of the component in subsequent operations and in apertures of the circuit board. After lead conditioning, the component is released and the gate 117 pivoted in the upper end of the chute 20 is operated by actuation of a cylinder 140 dropping the conditioned component into the chute. A light source and cell 200 detects arrival of the component at the stop 26 and on the mandrel 22. Activation of cell 200 signals the control unit 8 to cause the thruster 24 to move the component past the stop 26 and into engagement with another stop 26 which locates the component leads for engagement by the pair of notched fingers 28. The fingers close on the component leads and move the component down to insert the leads into apertures in the circuit board B. The cut-clinch unit 32 cuts and clinches the component leads against the underside of the board B. A typical lead conditioning unit as well as a mandrel are described in said U.S. Pat. No. 4,063,347 to which reference may be had for a more complete description. Obviously, the conditioning unit could be replaced with a unit for performing other than lead straightening operations on the components. A typical cut-clinch unit is described in said U.S. application Ser. No. 271,835 and a typical finger mechanism is described in U.S. Pat. No. 3,550,238, the application and patent being incorporated herein by reference if details of operation are desired. Each of the units for lead conditioning, the mandrel finger and cut-clinch mechanism preferably are settable for operating on the various center spacings of the component leads as they arrive at each unit. The center spacings are signalled by the locating pins 32 and switches 35 and arrival of each component C at each unit by various photocells and limit switches while the control unit 8 keeps track of component locations and their size and causes each of these units to be suitably adjusted. The above type of operation is the subject of copending application Ser. No. 271,835, filed June 9, 1981, and such application is herein incorporated by reference.

It should also be obvious that a variety of mechanisms, signalling devices and controls could be substituted for those described without departing from the scope of the invention which is defined by the following claims:

We claim:

1. In a machine for applying to circuit boards components selected individually from magazines and having picker means movable in a predetermined sequence between selected magazines and a component conditioning means, the improvement in which the picker means includes at least two pickers movable along opposite sides of a path in which the magazines are arranged, each picker having a receptacle movable between a retracted position to an advanced position for receiving a component selected from a predetermined magazine, the pickers being arranged to pass without interference during movement between the conditioning means and the magazines when at least one of said receptacles is in retracted position.

2. A machine according to claim 1 in which each magazine has a plurality of raceways from which individual components are delivered as controlled by an escapement mechanism for each raceway operable from opposite sides of the path by one of the picker receptacles moving into and out of the path.

3. A machine according to claim 1 and also provided with a shuttle into which each selected component is deposited from either picker receptacle and which is movable to deliver the component to the conditioning means and to return to receive another component from either of said pickers after deposition of a component in the conditioning means.

4. A machine according to claim 1 in which the conditioning means include means for applying components to circuit boards and means for transferring components to the applying means.

5. A machine according to claim 3 in which the pickers, shuttle and conditioning means are operated in a predetermined interdependent sequence adapted to handle a plurality of components at the same time with at least one component in each of the pickers, shuttle and conditioning means.

6. A machine according to claim 4 in which the pickers, the conditioning means, the transfer means and the applying means are operated in a predetermined interdependent sequence adapted to handle a plurality of components at the same time with one component in each of the pickers, conditioning means, transfer means and the applying means.

7. A machine according to claim 1 in which the pickers are movable along guideways at opposite sides of the magazine path and parallel thereto.

8. A machine according to claim 3 in which the magazine path extends in a substantially straight line intersected by the path of movement of the shuttle.

9. A machine according to claims 3, 5 and 6 in which sensing means are provided to detect passage of components into each picker receptacle and into the shuttle and into the conditioning means for controlling the sequential operation of the pickers, shuttle and conditioning means.

10. A machine according to claims 3, 5 and 6 in which sensing means including light sources and photoelectric cells and limit switches are provided to detect passage of components into each means for operating on each component for controlling sequential operation thereof.

11. A machine according to claim 8 in which the sensing means also detects the location and condition of the pickers, shuttle and conditioning means.

* * * * *